United States Patent
Tsukagoshi

(10) Patent No.: US 8,091,215 B2
(45) Date of Patent: Jan. 10, 2012

(54) TAPE FEEDER AND MOUNTING APPARATUS

(75) Inventor: Kazuhiro Tsukagoshi, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 267 days.

(21) Appl. No.: 12/438,277

(22) PCT Filed: Aug. 23, 2007

(86) PCT No.: PCT/JP2007/066346
§ 371 (c)(1),
(2), (4) Date: Feb. 20, 2009

(87) PCT Pub. No.: WO2008/023757
PCT Pub. Date: Feb. 28, 2008

(65) Prior Publication Data
US 2010/0242267 A1    Sep. 30, 2010

(30) Foreign Application Priority Data

Aug. 23, 2006 (JP) ................................. 2006-227076
Aug. 23, 2006 (JP) ................................. 2006-227078

(51) Int. Cl.
*B23P 19/00* (2006.01)

(52) U.S. Cl. .......... 29/740; 29/743; 29/834; 414/416.05

(58) Field of Classification Search ............ 29/740–743, 29/833–834, 705, 719–720; 414/416.02, 414/416.05; 226/32, 45, 133
See application file for complete search history.

(56) References Cited

U.S. PATENT DOCUMENTS

| 6,101,709 | A * | 8/2000 | Shiota | 29/833 |
| 6,162,007 | A * | 12/2000 | Witte | 414/416.01 |
| 6,902,090 | B2 * | 6/2005 | Yamamura et al. | 226/32 |
| 7,784,660 | B2 * | 8/2010 | Horie | 226/128 |
| 7,802,957 | B2 * | 9/2010 | Yamamura et al. | 414/416.05 |
| 2005/0160593 | A1 * | 7/2005 | Yamamura et al. | 29/832 |

FOREIGN PATENT DOCUMENTS

| JP | 7242284 A | 9/1995 |
| JP | 11054988 A | 2/1999 |
| JP | 2000049494 A | 2/2000 |
| JP | 2001036294 A | 2/2001 |
| JP | 2003188580 A | 7/2003 |
| JP | 2005-184031 A | 7/2005 |
| WO | 03/101172 A1 | 12/2003 |

OTHER PUBLICATIONS

The Extended European Search Report dated Dec. 29, 2010; Application No./Patent No. 07792924.8-2214 / 2059111 PCT/JP2007066346.

* cited by examiner

*Primary Examiner* — Minh Trinh
(74) *Attorney, Agent, or Firm* — Studebaker & Brackett PC; Donald R. Studebaker

(57) ABSTRACT

When a component (X) is fed to a pickup position (53) but no suction action is carried out due to a variety of reasons, a reverse feeding action is carried out to return the component (X), which has been fed to the pickup position (53), to a position upstream of the pickup position (53) in the tape feeding direction. The same component (X) is thus not wasted but is resupplied to the pickup position (53) in the following pickup action, whereby the amount of waste of components is reduced.

3 Claims, 13 Drawing Sheets

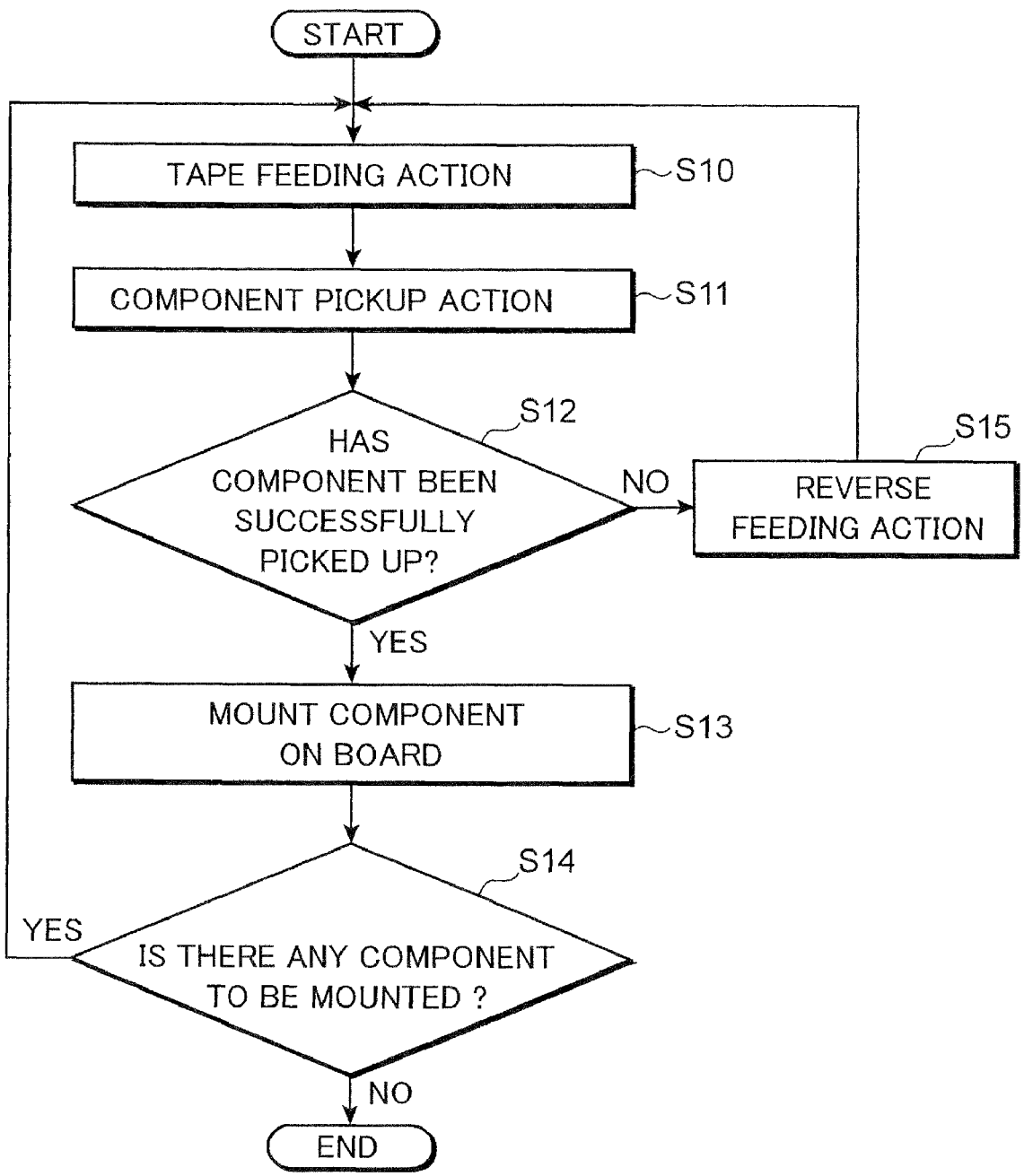

TAPE FEEDING DIRECTION

REVERSED BY A PLURALITY OF FRAMES

TAPE FEEDING DIRECTION

TAPE FEEDER AND MOUNTING APPARATUS

TECHNICAL FIELD

The present invention relates to a tape feeder that is attached to a mounting apparatus and supplies electronic components, and a mounting apparatus.

BACKGROUND ART

There has been known a tape feeder as a component supplying apparatus that is to be attached to a mounting apparatus for mounting electronic components on a board and supplies electronic components to the mounting apparatus.

Such a tape feeder is configured, as described in the patent document 1 indicated below, in such a way that a tape that holds components disposed at fixed intervals is wound on a reel and the tape unwound from the attached reel is fed to a pickup position where a transfer head in the mounting apparatus sucks an electronic component. The tape that holds electronic components engages a sprocket provided in the tape feeder, and the sprocket intermittently rotates by a predetermined feeding amount. In this way, the electronic components held on the tape successively reach the pickup position.

In such a mounting apparatus, however, even when a component is fed to the pickup position, no suction action is carried out in some cases due to a variety of reasons, for example, when the transfer head fails to suck a component in the pickup position, when only a feeding action is carried out without sucking any component in order to check, for example, whether components are fed in a stable manner, or when the tape feeder is removed from the mounting apparatus and exchanged after a component has been fed to the pickup position. In such cases, the component once fed to the pickup position is typically discarded, resulting in waste of components.

Patent Document 1: Japanese Patent Laid-Open No. 7-242284

DISCLOSURE OF THE INVENTION

The present invention has been made in view of the problems described above. An object of the present invention is to provide a tape feeder and a mounting apparatus which can reduce waste of components.

To achieve the object, a tape feeder according to the present invention includes a sprocket that engages a tape that holds components at predetermined intervals, a motor that rotates the sprocket to feed the tape to a predetermined pickup position, and a controller that drives and controls the motor. The controller is configured to carry out a tape feeding action in which the motor is driven in the forward direction to successively feed the components held on the tape to the pickup position, and a reverse feeding action in which the motor is driven in the reverse direction to return a component fed to the pickup position to a position upstream of the pickup position in the tape feeding direction.

Since the tape feeder can return a component that has been fed to the pickup position to a position upstream of the pickup position in the reverse feeding action, such a component can be reused, and hence the amount of waste of components can be reduced.

In the tape feeder, when the controller receives a removal instruction to remove the tape feeder from a mounting apparatus, the controller allows to carry out the reverse feeding action to return the component that has been fed to the pickup position or the position immediately upstream thereof in the tape feeding direction to a covered position where the component is not exposed to the outside.

According to the above configuration, when the tape feeder is still attached to the mounting apparatus and a component has been fed to the pickup position or the position immediately upstream thereof, the component is returned in the reverse feeding action to a covered position where the component is not exposed to the outside when the tape feeder is removed from the mounting apparatus. It is thus possible to prevent in advance the component, for example, from dropping when the tape feeder is removed.

A mounting apparatus according to the present invention is a mounting apparatus to which the tape feeder described above is attachable. When the tape feeder is removed from the mounting apparatus, the amount of return in the reverse feeding action is related to identification information and stored, the identification information allowing the tape feeder to be identified, whereas when the tape feeder is attached to the mounting apparatus, the tape feeder is instructed to carry out the tape feeding action based on the amount of return that has been related to the identification information on the tape feeder and stored.

According to the mounting apparatus, when the tape feeder that has been removed from the mounting apparatus is reattached to the mounting apparatus, the tape feeding action is carried out based on the amount of return at the time of the removal. It is thus possible to quickly start manufacturing boards using the reattached tape feeder.

A mounting apparatus according to the present invention is a mounting apparatus to which the tape feeder described above is attachable, and includes a photographing device for photographing the vicinity of the pickup position for the tape feeder. The mounting apparatus is configured, when the tape feeder is attached to the mounting apparatus, to instruct the photographing device to photograph the vicinity of the pickup position for the tape feeder and the tape feeder to carry out the tape feeding action in such a way that in the captured image, the first component reaches the pickup position or the position immediately upstream thereof in the tape feeding direction.

According to the mounting apparatus, when the tape feeder is attached to the mounting apparatus, the tape feeding action is carried out in such a way that in the captured image showing the vicinity of the pickup position, the first component reaches the pickup position or the position immediately upstream thereof. It is thus possible to quickly start manufacturing boards using the attached tape feeder.

Another mounting apparatus according to the present invention is a mounting apparatus to which a plurality tape feeders are attachable, each of the tape feeders successively feeding components held on a component supplying tape at predetermined intervals to a predetermined pickup position. The mounting apparatus includes a transfer head that picks up and transfers a component fed to the pickup position for each of the tape feeders to a predetermined mounting position on a board, and a tape feeding action controller for controlling each of the tape feeders so as to feed components held on the tape to the pickup position and carry out a tape feeding action to place the component that has not been picked up in the pickup position again, when the transfer head has not picked up a component.

According to the mounting apparatus, for example, when the transfer head fails to pick up a component, the component that has been unsuccessfully picked up is placed in the pickup position again. Therefore, the component that has been fed to the pickup position but, for example, has been unsuccessfully sucked is not discarded but can be reused to reduce waste of components.

BRIEF DESCRIPTION OF THE DRAWINGS

FIG. 5 is a flowchart showing the procedure of a component mounting action;

BEST MODE FOR CARRYING OUT THE INVENTION

Preferred embodiments of the present invention will be described below in detail with reference to the accompanying drawings.

Figure 1:
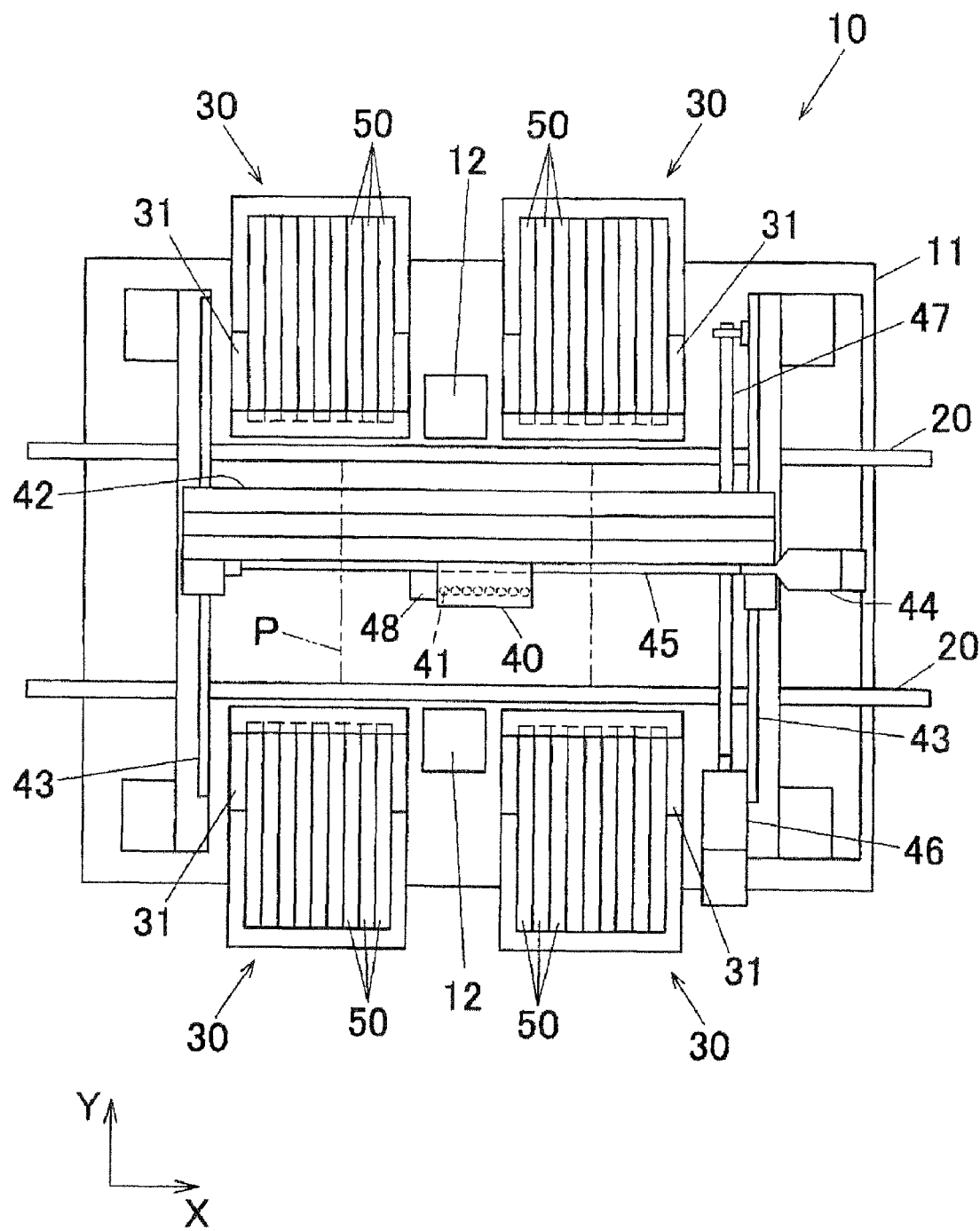
FIG. 1 is a plan view showing a mounting apparatus according to a first embodiment of the present invention.

FIG. 1 is a plan view showing a mounting apparatus according to a first embodiment of the present invention (a mounting apparatus to which a tape feeder according to the present invention is attached). As shown in FIG. 1, the mounting apparatus 10 includes conveyers 20, 20 that are disposed on a base 11 and transport printed boards P, component suppliers 30 disposed on both sides of the conveyers 20, 20, and an electronic component mounting head unit 40 provided above the base 11.

The head unit 40 can move across an area between any of the component suppliers 30 and a mounting position on a board P so that the head unit 40 can pick up an electronic component from the component supplier 30 and mount the electronic component in a predetermined mounting position on the board P. Specifically, the head unit 40 is movably supported in an X-axis direction (the direction in which the conveyers 20 transport boards) by a head unit supporting member 42 extending in the X-axis direction, and both ends of the head unit supporting member 42 are in turn movably supported in a Y-axis direction (the direction perpendicular to the X-axis direction in a horizontal plane) by guide rails 43, 43 extending in the Y-axis direction. The head unit 40 is driven by an X-axis motor 44 via a ball screw shaft 45 in the X-axis direction, and the head unit supporting member 42 is driven by a Y-axis motor 46 via a ball screw shaft 47 in the Y-axis direction.

A plurality of transfer heads 41 arranged in the X-axis direction are mounted on the head unit 40. Each of the transfer heads 41 is driven in the up-down direction (Z-axis direction) by a lifting mechanism using a Z-axis motor as a driving source, and also driven in the rotational direction (R-axis direction) by a rotary drive mechanism using an R-axis motor as a driving source.

A suction nozzle for sucking an electronic component and mount it on a board is provided at the tip of each of the transfer heads 41. A negative pressure is supplied from a negative pressure device (not shown) to each of the nozzles when a component is sucked, and a suction force resulting from the negative pressure can be used to suck and pick up an electronic component. A pressure sensor (not shown) that detects the level of the negative pressure is also provided in each of the nozzles. The pressure sensor can judge from the change in the negative pressure in each of the nozzles whether or not the nozzle has successfully picked up (sucked) a component.

A board photographing camera 48 comprised of a CCD camera or any other similar camera equipped with an illuminator is also provided in the head unit 40. The board photographing camera 48 can photograph a position reference mark and a board ID mark provided on a board P that has been transported in the mounting apparatus 10. The board photographing camera 48 also serves as photographing device for photographing the vicinity of an electronic component pickup position for each of tape feeders 50 attached to the component suppliers 30.

The number of component suppliers 30 is four in total, upstream and downstream component suppliers provided on the front side of the conveyers 20, 20, and upstream and downstream component suppliers provided on the rear side. A plurality of tape feeders 50 as component supplying devices can be arranged and attached onto a feeder plate 31 of each of the component suppliers 30.

Component photographing cameras 12, 12 are provided on the front and rear sides between the upstream component supplier 30 and the downstream component supplier 30. Each of the component photographing cameras 12, 12 photographs a component sucked by the head unit 40 to detect, for example, whether the component is misaligned with the suction nozzle. Each of the component photographing cameras 12, 12 can also judge from the presence or absence of a component sucked by any of the suction nozzles whether or not the suction nozzle has successfully picked up (sucked) the component. The component photographing camera 12 therefore serves, along with the pressure sensor provided in each of the suction nozzles, as a component pickup success/failure judgment device.

Figure 2:
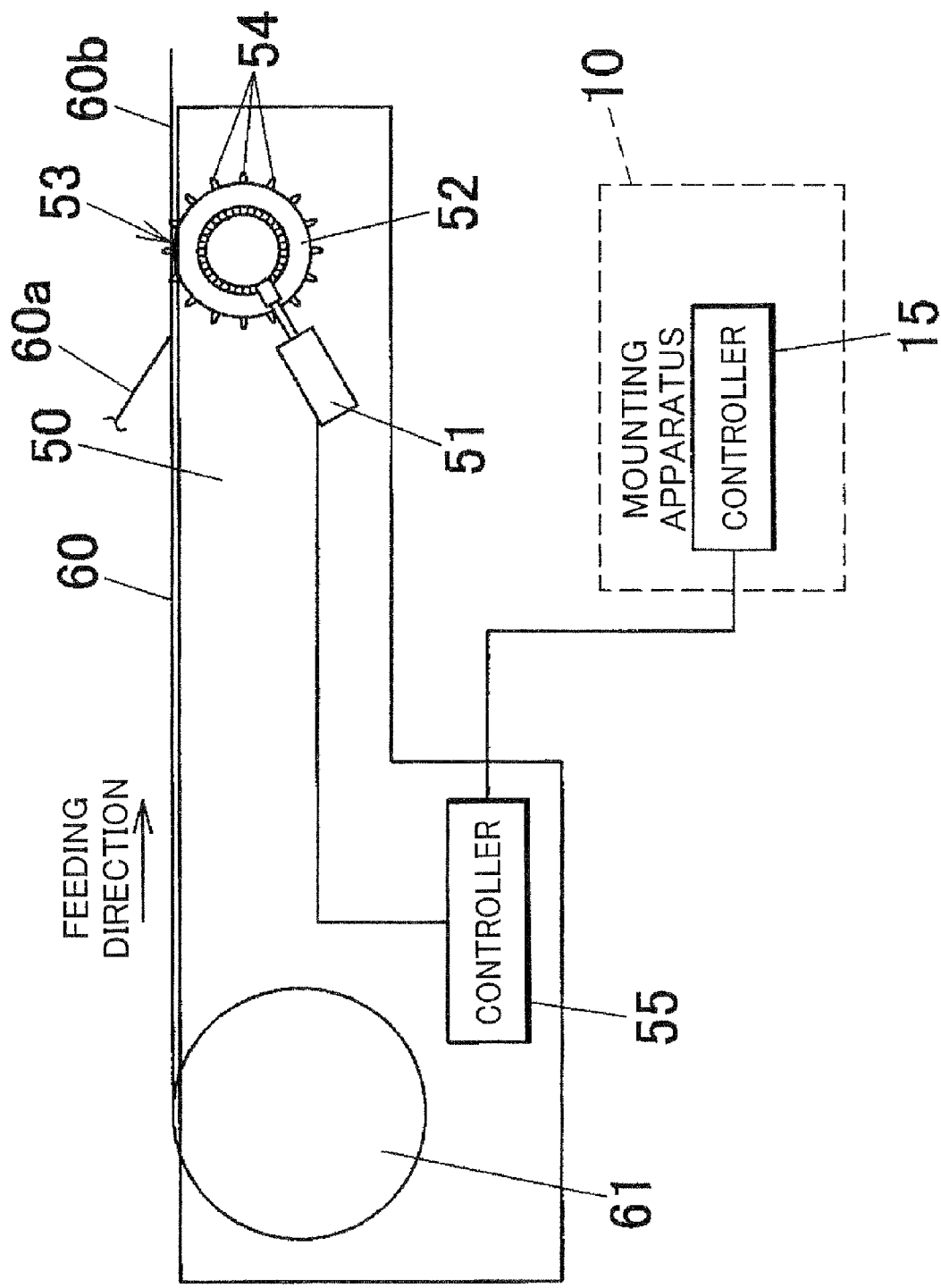
FIG. 2 is a diagram for explaining a schematic configuration of a tape feeder according to an embodiment of the present invention.
Figure 3:
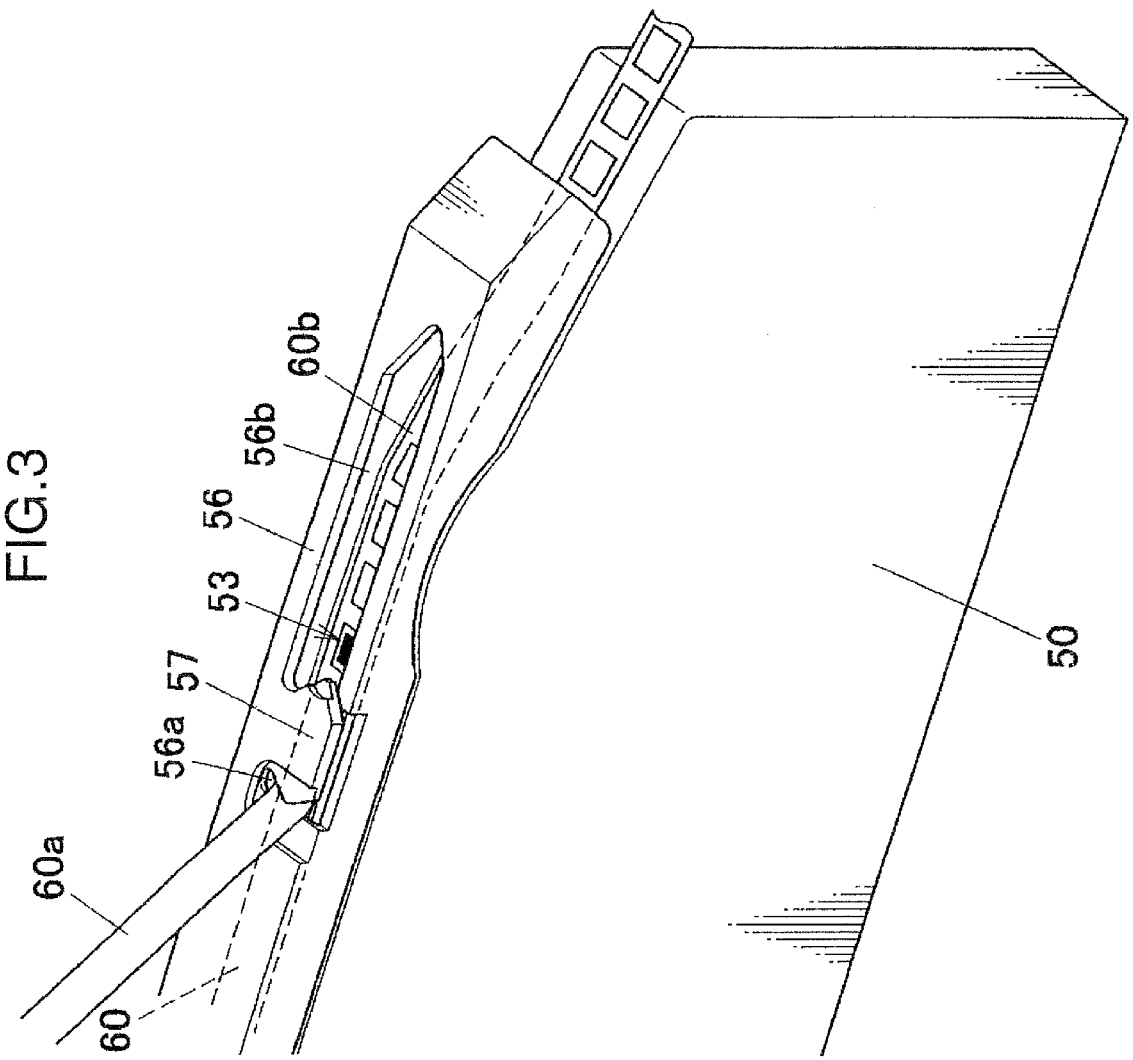
FIG. 3 is a perspective view of a front portion of the tape feeder.
Figure 4:
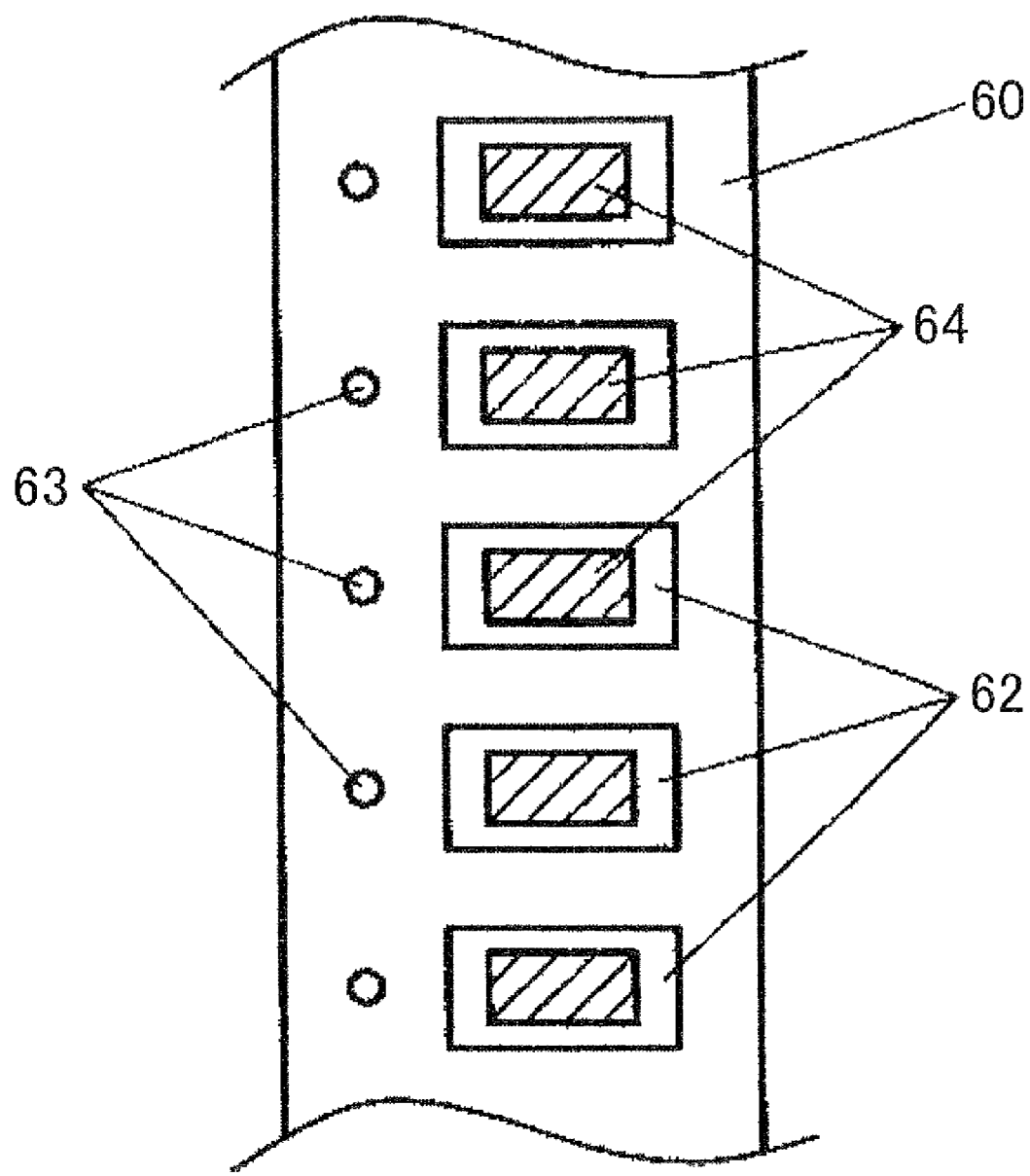
FIG. 4 is a plan view showing an example of a component supplying tape installed in the tape feeder.

FIG. 2 is a diagram for explaining a schematic configuration of a tape feeder according to an embodiment of the present invention. FIG. 3 is a perspective view of a front portion of the tape feeder. FIG. 4 is a plan view showing an example of a component supplying tape installed in the tape feeder.

The tape feeder 50 according to the embodiment is configured as a motorized component supplying device including a motor 51 as a driving source.

A reel 61 around which a tape 60 that holds electronic components is wound is attached to the tape feeder 50. The tape 60 unwound from the reel 61 is fed by a sprocket 52 rotated by the motor 51.

The tape 60 has component pockets 62 that store and hold ICs, transistors, or other small-sized components 64 at predetermined intervals. The tape 60 also has perforations 63 right next to a center of the component pockets 62 at the same intervals as the component pockets 62 in a feeding direction. The interval (pitch) between components 64 on the tape 60 is hereinafter referred to as one frame. A cover tape 60a is provided over the upper side of the tape 60 so that openings of the component pockets 62 are covered.

Radially protruding pins 54 are provided on the sprocket 52 in the tape feeder 50 at the same intervals as the perforations 63 in the tape. The pins 54 provided on the sprocket 52 engage the perforations 63 provided in the tape 60 to feed the tape 60. The electronic components 64 held on the tape 60 are successively fed to a predetermined pickup position 53 where the head unit 40 picks up the electronic components.

A tape guide member 56 that guides the running tape 60 is provided over a front portion of the tape feeder 50, and the pickup position 53 is set within an exposing hole 56b provided in the tape guide member 56. A cover tape outlet hole 56a that separates the cover tape 60a from a tape body 60b and removes the cover tape 60a is provided upstream of the exposing hole 56b in the tape running direction.

In the tape guide member 56, the portion between the cover tape outlet hole 56a and the exposing hole 56b within which the pickup position 53 is set serves as a tape cover 57 that covers the space above component pockets 62 from which the cover tape 60a is separated, and prevents the components 64 in these component pockets 62 from being exposed to the outside. In the embodiment, the portion that the tape cover 57 or the portion of the tape guide member 56 that is upstream of the cover tape outlet hole 56a prevents from being exposed to the outside is hereinafter referred to as a covered position.

The motor 51 that rotates the sprocket 52 can rotate both in forward and backward directions, and is comprised of a servo motor or any other similar motor that can control the angle of rotation (phase). The rotation of the motor 51 is controlled in accordance with a control signal from a controller 55 provided in the tape feeder 50.

The controller 55 drives the motor 51 in the forward direction to carry out a tape feeding action in which the components 64 held on the tape 60 are successively fed to the pickup position 53.

The controller 55 can also reverse the motor 51 as required to carry out a reverse feeding action in which components 64 that have been fed to the pickup position 53 or positions downstream thereof are returned to positions upstream of the pickup position 53. The reverse feeding action will be described later.

When the tape feeder 50 is attached to the mounting apparatus 10, the controller 55 in the tape feeder 50 is electrically connected to a controller 15 in the mounting apparatus 10 so that the mounting apparatus 10 supplies electric power for driving the motor 51 and other components and a control signal for driving the motor 51 and other signals are communicated between the tape feeder 50 and the mounting apparatus 10.

The controller 15 in the mounting apparatus 10 and the controller 55 in the tape feeder 50 cooperate to control actions in the mounting apparatus 10 in which the tape feeder 50 is incorporated. These controllers serve as a tape feeding action controller for instructing the tape feeder 50 to carry out the tape feeding action and the reverse feeding action at each timing in a component mounting action, which will be described later.

The component mounting action in the mounting apparatus 10 will be described below.

FIG. 5 is a flowchart showing the procedure of the component mounting action in the mounting apparatus according to the present embodiment. FIG. 6 explains a case where a component has been unsuccessfully picked up the mounting action.

As shown in FIG. 5, in the component mounting action in the mounting apparatus 10, the tape feeding action is first carried out (step S10), and then a component pickup action is carried out (step S11) in which any of the suction nozzles sucks and picks up a component 64 that has been fed to the pickup position 53.

It is then judged whether the component has been successfully picked up (step S12). In the embodiment, whether or not the pickup action has been successfully carried out is judged from the nozzle's negative pressure value detected by the pressure sensor that serves as the pickup success/failure judgment device and the suction nozzle's vertical position data in the lifting mechanism that drives the transfer head 41, that is, the suction nozzle in the Z-axis direction. Specifically, the judgment is made, after the negative pressure increases when the suction nozzle in the pickup position 53 is lowered to the suction position and the tip of the suction nozzle abuts a component, by judging whether or not the elevated negative pressure decreases after the suction nozzle in the pickup position 53 is lifted by a predetermined amount. The pickup action has been successfully carried out when the elevated negative pressure is maintained after the suction nozzle in the pickup position 53 is lifted by a predetermined amount. When the head unit 40 then moves the suction nozzle to the area above the component photographing cameras 12, 12, it is judged from a photographing result obtained by using the component photographing cameras 12, 12 to photograph the component sucked by the suction nozzle whether or not the component has dropped from the suction nozzle during the horizontal motion.

When the component has been successfully picked up (YES in the step S12), the component picked up by the suction nozzle is mounted on a board (step S13). When there are still components to be mounted on the board, the above actions are repeated (YES in the step S14), whereas there is no component to be mounted, the procedure is terminated (NO in the step S14).

Figure 6A:
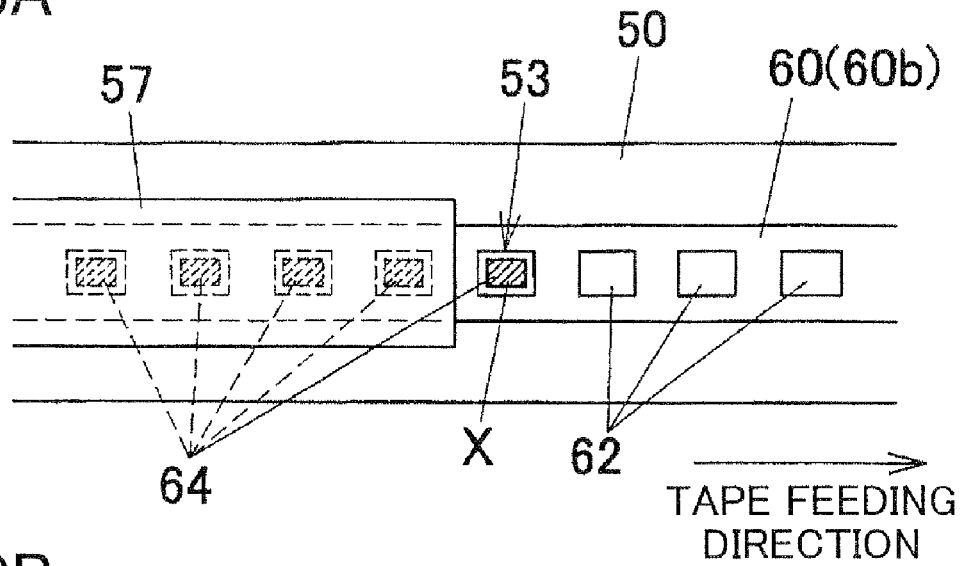
FIG. 6 explains a case where a component has been unsuccessfully picked up in the mounting action.
Figure 6B:
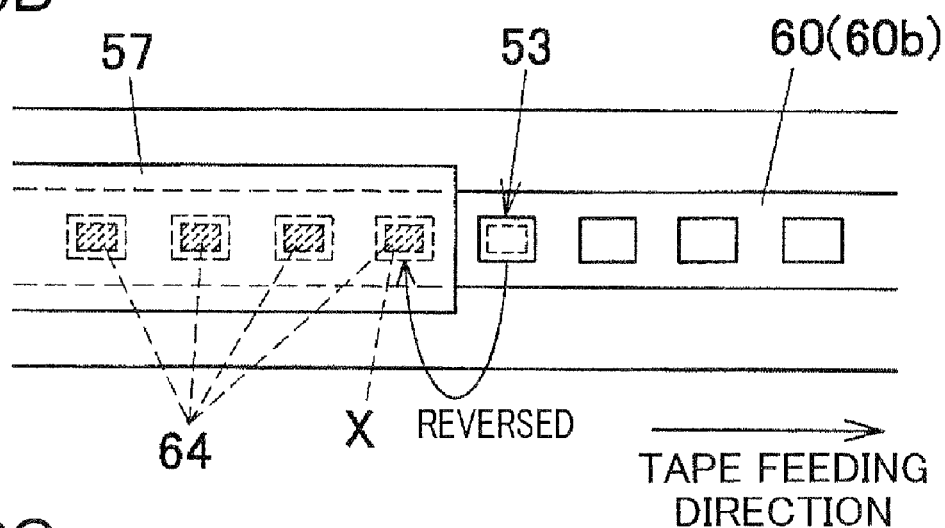

On the other hand, when the component pickup action has failed (NO in the step S12), the component X that should have been picked up is left in the pickup position 53, as shown in FIG. 6A. In this case, as shown in FIG. 6B, the reverse feeding action (step S15) is carried out to return the component X to the position immediately upstream of the pickup position 53 by one frame (by the interval between components 64 on the tape 60) in the tape feeding direction. The control then returns to the action step for mounting the next component.

Figure 6C:
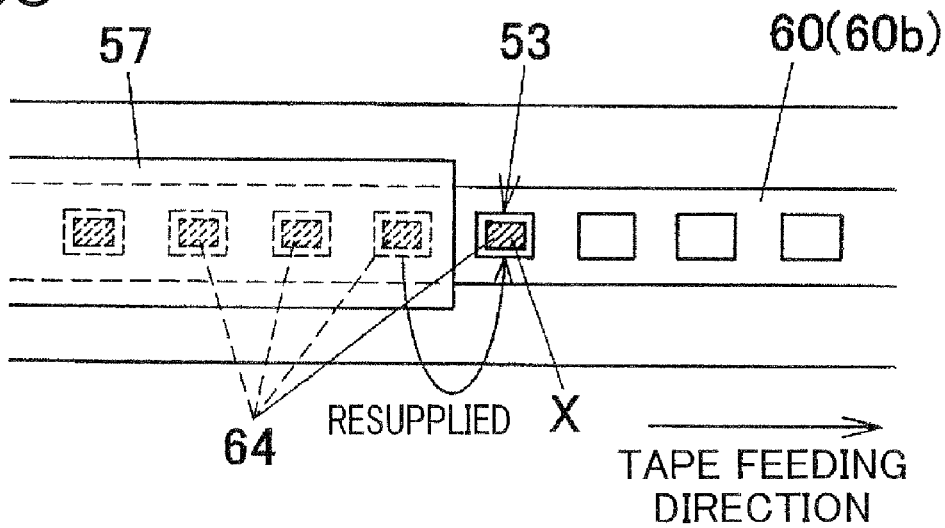

In this way, the following tape feeding action (step S10) allows the component X that has been unsuccessfully picked up to be resupplied to the pickup position 53 and reused in the following pickup action, as shown in FIG. 6C. It is thus possible to prevent the component that has been unsuccessfully picked up from being wasted.

A description will be made of a case where no component is picked up but only the tape feeding action is carried out to check whether components are fed, for example, in a stable manner for each of the tape feeders 50 attached to the mounting apparatus 10.

Figure 7:
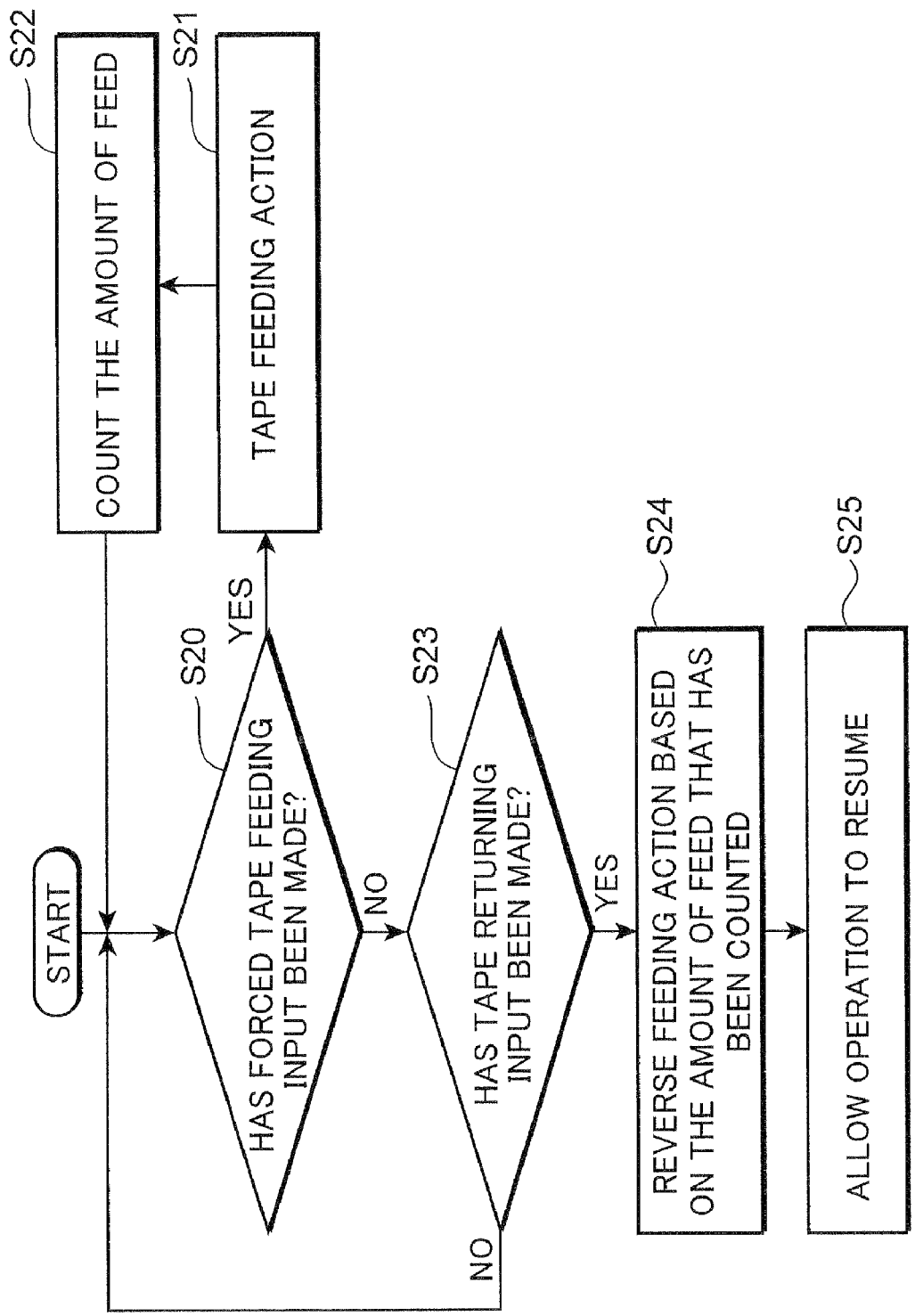
FIG. 7 is a flowchart showing a procedure of actions carried out when no component is picked up but only tape feeding action is carried out.

FIG. 7 is a flowchart showing a procedure of actions carried out when no component is picked up but only the tape feeding action is carried out in the mounting apparatus according to the present embodiment. FIG. 8 explains the above actions.

As shown in FIG. 7, checking whether components are fed, for example, in a stable manner is carried out when a forced tape feeding input that forces the tape feeding action to be carried out is made by an operator or any other person to an input switch provided in the tape feeder 50, an input operation unit in the mounting apparatus 10, or any other input-related unit (step S20).

When the forced tape feeding input is made (YTS in the step S20), the tape feeder 50 carries out the tape feeding action, but no component 64 is picked up in the pickup position 53 (step S21). In this process, the operator or any other person visually inspects or otherwise checks the tape feeding action. At the same time, the controller 55 in the tape feeder 50 counts and stores the amount of tape feed (the number of frames) in the tape feeding action carried out in response to the forced tape feeding input (step S22).

Figure 8A:
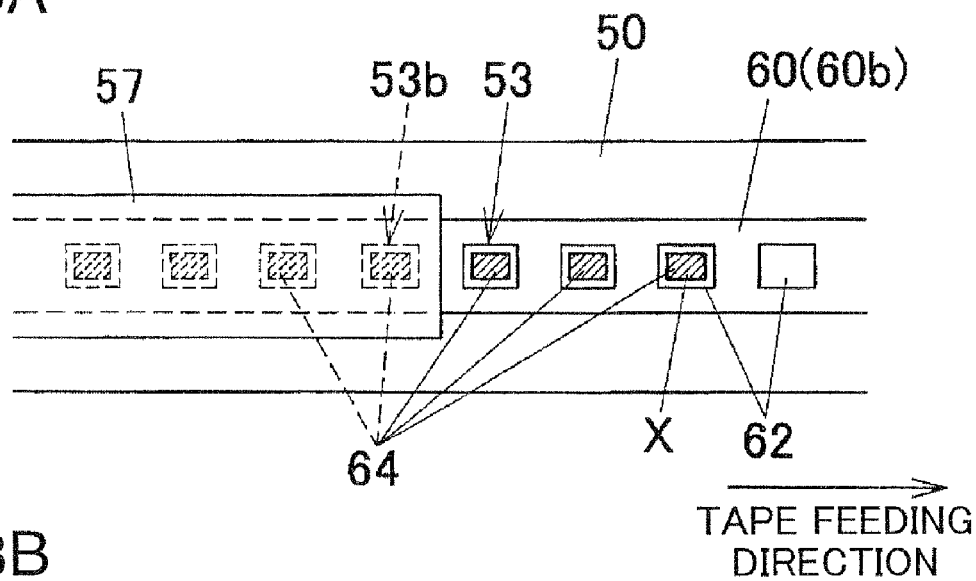
FIG. 8 explains the above actions.

In general, the checking whether components are fed, for example, in a stable manner is carried out by repeating the tape feeding action described above multiple times. As a result, for example, as shown in FIG. 8A, in each of the tape feeders 50, components 64 are left in an area downstream of the pickup position 53, The number of components 64 being the number of tape feeding actions (the number of frames) repeated without the pickup action.

After the operator or any other person has carried out the tape feeding action arbitrary times, the operation of the mounting apparatus 10 is resumed when a tape return input that returns the tape is made by the operator or any other person to an input switch provided in the tape feeder 50, an input operation unit in the mounting apparatus 10, or any other input-related unit (step S23).

Before the tape returning input is made, the control repeatedly waits for the forced tape feeding input and the tape returning input described above are made (NO in the steps S20 and S23).

When the tape returning input is made (YES in the step S23), the tape is reversed by a plurality of frames (step S24) based on the amount of feed (the number of frames) obtained by counting the tape feeding action carried out in response to the forced tape feeding input, and the operation is allowed to resume (step S25).

Now, assume that the tape returning input may not be necessarily made by the operator or any other person. In the judgment made in the step S23, when no tape returning input is made, it is judged whether or not the time that has lapsed since the forced tape feeding input exceeds a predetermined time. When the lapsed time does not exceed the predetermined period, the control proceeds to the step S20, whereas when the lapsed time exceeds the predetermined period, a monitor (not shown) displays a message indicating that there is no tape returning input and the operation is allowed to resume (step S25).

Figure 8B:
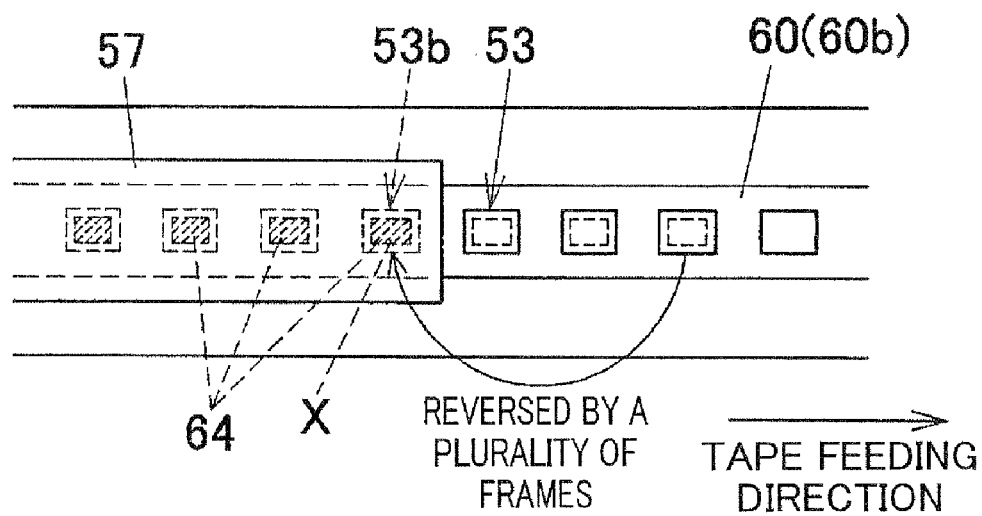

In the example shown in FIG. 8A, assume that the first component X on the tape 60 is located, before the tape is fed, in the position 53b immediately upstream of the pickup position 53 by one frame (by the interval between components 64 on the tape 60), and the first component X is fed from that position by three frames. In this case, the stored amount of feed is three frames. Therefore, when the tape is reversed by three frames, the first component X returns to the position 53b immediately upstream of the pickup position 53, which is the position where the first component X was located before the feeding of the tape, as shown in FIG. 8B.

When the tape feeding action is carried out in the following component pickup action, the first component X is fed to the pickup position 53 and used. Therefore, even when the tape feeding action is carried out but no pickup action is carried out to check whether components are fed, for example, in a stable manner, components fed to an area downstream of the pickup position 53 will not be discarded or wasted, but can be effectively used.

A description will be made of a case where, for example, changing the type of board to be manufactured in the mounting apparatus 10 requires removing any of the attached tape feeders 50 and then reattaching the tape feeder 50.

Figure 9B:
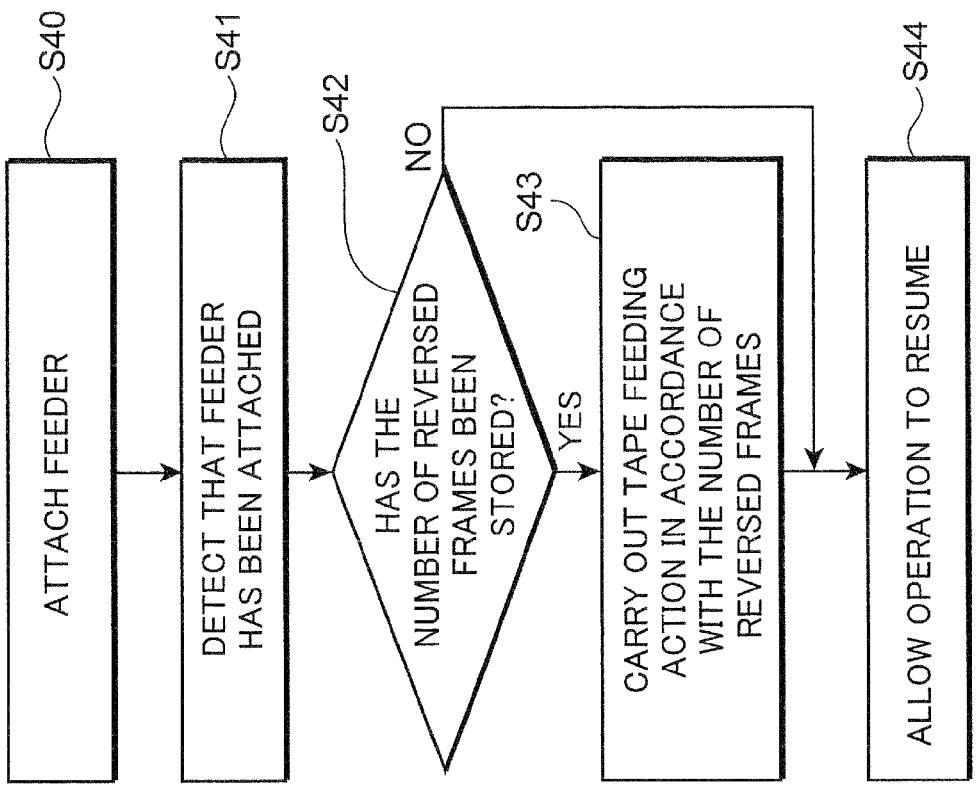
FIG. 9B is a flowchart showing a procedure of actions carried out when the tape feeder is attached to the mounting apparatus.
Figure 9A:
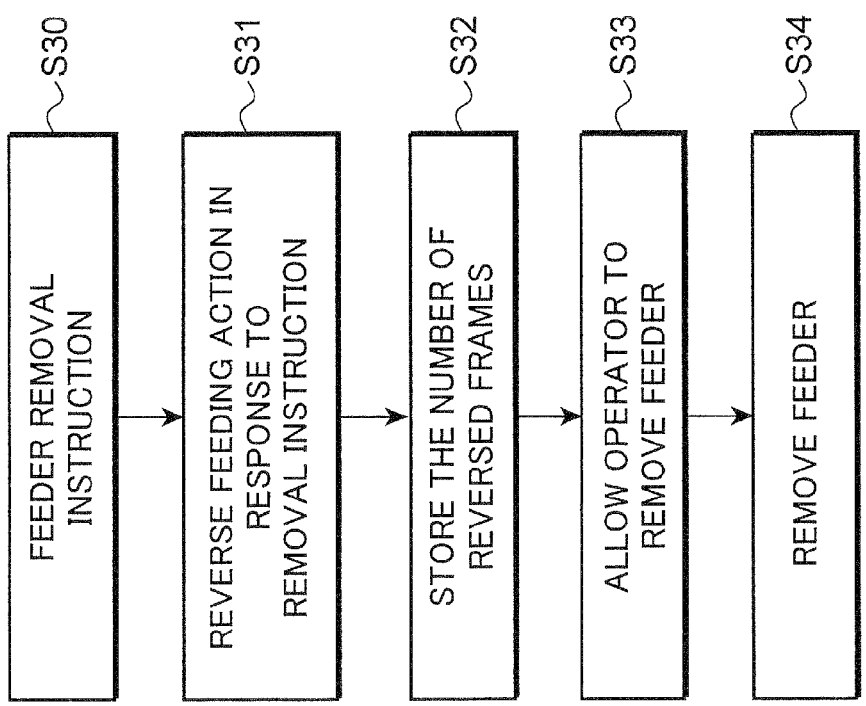
FIG. 9A is a flowchart showing a procedure of actions carried out when the tape feeder is removed from the mounting apparatus.

FIG. 9A is a flowchart showing a procedure of actions carried out when any of the tape feeders is removed from the mounting apparatus according to the present embodiment. FIG. 9B is a flowchart showing a procedure of actions carried out when the tape feeder is attached to the mounting apparatus. FIG. 10 explains the above actions.

As shown in FIG. 10, the following description will be made with reference to a case where the pickup position 53 is set in a position downstream of the position in the tape running direction immediately after the covered positions that the tape cover 57 prevents from being exposed to the outside.

As shown in FIG. 9A, removal of any of the tape feeders 50 from the mounting apparatus 10 is initiated by a feeder removal instruction issued from the controller 15 in the mounting apparatus 10 or a removal instruction inputted by the operator or any other person (step S30). The input from the operator or any other person is made to an input switch provided in the tape feeder 50, an input operation unit in the mounting apparatus 10, or any other input-related unit, and transferred to the controller 55 in the tape feeder 50.

The controller in the tape feeder 50 that has received the feeder removal instruction reversed the tape by multiple frames to return the component that has been fed to the pickup position to any of the covered positions where the component is not exposed to the outside (step S31), and stores the number of reversed frames (step S32).

The operation of storing the number of reversed frames may be carried out either by the controller 55 in the tape feeder 50 or the controller 15 in the mounting apparatus 10. When the controller 15 in the mounting apparatus 10 stores the number, the number is related to a feeder number or other identification information that allows the tape feeder in question to be identified before the number is stored.

Figure 10A:
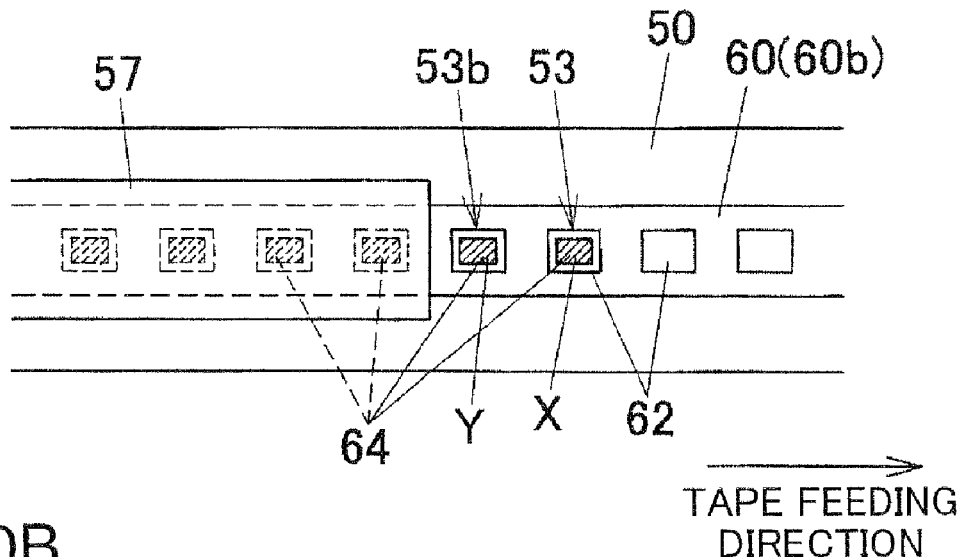
FIG. 10 explains the above actions.
Figure 10B:
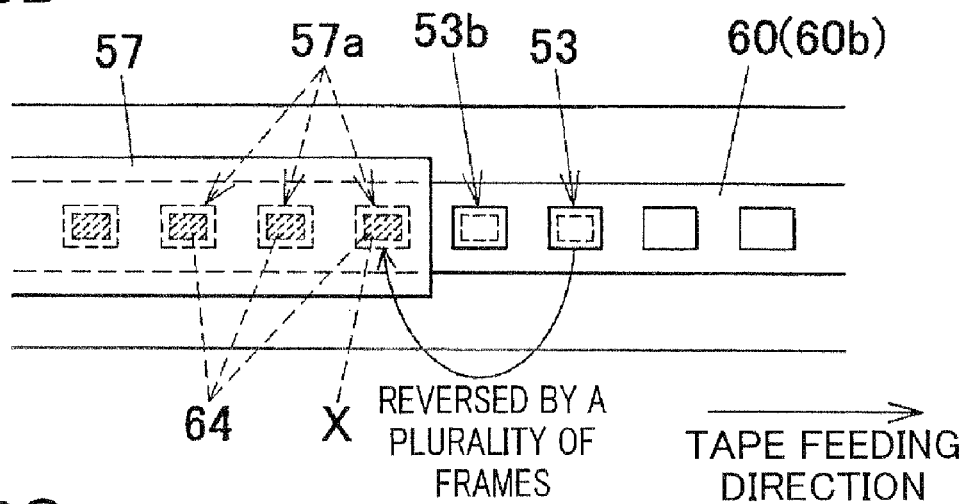

In the example shown in FIG. 10, at the timing shown in FIG. 10A when the feeder removal instruction is received, the first component X has been fed to the pickup position 53. In this case, as shown in FIG. 10B, the tape is reversed by multiple frames until the first component X reaches a covered position 57a where the tape cover 57 hides the first component X.

The amount of return in the reverse feeding action may be set to a predetermined number of frames or may be set based on the information on the position of the first component when the tape feeder 50 is removed.

Although the first component X is returned to the most downstream position of covered positions 57a in FIG. 10B, the reverse feeding action may be carried out to return the first component X to an upstream position beyond the most downstream position.

When the feeder removal instruction is received, and the first component is not the component X in the pickup position 53 but a component Y in the position immediately upstream of the pickup position 53 (when no component X is present in FIG. 10A), the tape may be reversed by multiple frames until the component Y in the position immediately upstream of the pickup position 53 is returned to any of the covered positions 57a.

When the component X that has been fed to the pickup position 53 or the component Y in the position 53b immediately upstream thereof is returned to any of the covered positions 57a, the controller 55 in the tape feeder 50 notifies the operator or any other person via a display section provided in the tape feeder 50, a monitor screen provided in the mounting apparatus 10, or any other display section that the tape feeder 50 is allowed to be removed (step S33). In response to the notification, the operator or any other person removes the tape feeder 50 from the mounting apparatus 10 (step S34).

As described above, the reverse feeding action is carried out when any of the tape feeders 50 is removed from the mounting apparatus 10. Therefore, when the corresponding tape feeder 50 is still attached to the mounting apparatus, and there is a component 64 fed to the pickup position 53 or the position immediately upstream thereof, the component 64 is returned to any of the covered positions 57a where the component 64 is not exposed to the outside. It is thus possible to prevent in advance such a component from dropping when the tape feeder 50 is removed.

As shown in FIG. 9B, attaching the tape feeder 50 to the mounting apparatus 10 is initiated by the operator or any other person's action of actually attaching the tape feeder 50 to the mounting apparatus 10 (step S40).

When the mounting apparatus 10 or the tape feeder 50 itself detects that the tape feeder 50 has been attached to the mounting apparatus 10 (step S41), the controller 55 in the tape feeder 50 or the controller 15 in the mounting apparatus 10 judges whether or not the controller stores the amount of return (the number of reversed frames) made when the tape feeder 50 was removed (step S42). When the controller 15 in the mounting apparatus 10 makes the judgment, the identification information of the attached tape feeder 50 is read, and it is judged whether or not there is a stored amount of return related to the identification information.

When the amount of return (the number of reversed frames) is stored (YES in the step S42), the tape feeding action is carried out in accordance with the stored number of reversed frames (step S43), and the operation of the mounting apparatus 10 is allowed to resume (step S44).

Figure 10C:
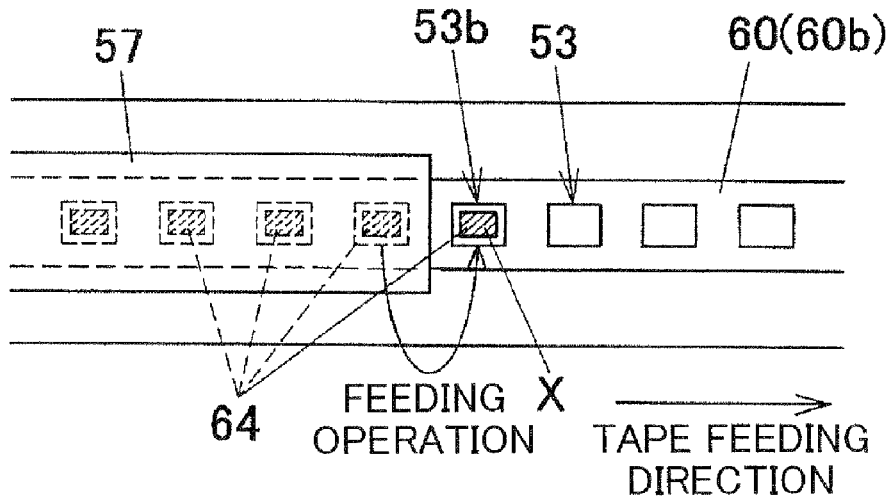

In the example shown in FIG. 10, the reverse feeding action from FIG. 10A to FIG. 10B causes the first component X in the pickup position 53 to be returned by 2 frames. In FIG. 10C, however, considering that the component feeding action is carried out before the component pickup operation, the tape is fed by one frame, the number obtained by subtracting one frame from the amount of return, which is 2 frames, in order to feed the first component X back to the position 53b immediately upstream of the pickup position 53.

When no component feeding action is carried out before the component pickup action, the tape may be fed by 2 frames, which is the amount of return, so that the first component X reaches the pickup position 53.

Alternatively, when the first component is in the position 53b immediately upstream of the pickup position 53 at the time of the removal of the tape feeder 50, and the first component is to be returned to the position 53b immediately upstream of the pickup position 53 again, the tape feeding action may be carried out by the number of frames that correspond to the amount of return.

On the other hand, when the tape feeder 50 in question has not stored the number of reversed frames (NO in the step S42), the operation is, in principle, allowed to resume under the current condition of the mounting apparatus (step S44). In this case, no component may have reached the pickup position 53 or the position 53b immediately upstream thereof, but components will be ready to be supplied by carrying out the forced tape feeding action until the first component is fed to the pickup position 53 or the position 53b immediately upstream thereof.

Even when the number of reversed frames has not been stored, a state in which the first component is expected to be fed to the pickup position 53 or the position 53b immediately upstream thereof may be achieved by automatically carrying out the tape feeding action by a predetermined number of frames.

As described above, when the tape feeder 50 that has been removed from the mounting apparatus 10 is reattached to the mounting apparatus 10, the tape feeding action is carried out based on the amount of return at the time of the removal. It is thus possible to quickly start manufacturing boards using the reattached tape feeder 50.

A description will be made of another example of the procedures of removing and attaching any of the tape feeders 50. In the following sections, detailed description of the same portions as those in the example described with reference to FIG. 9 will be omitted, and different portions will be described.

Figure 11B:
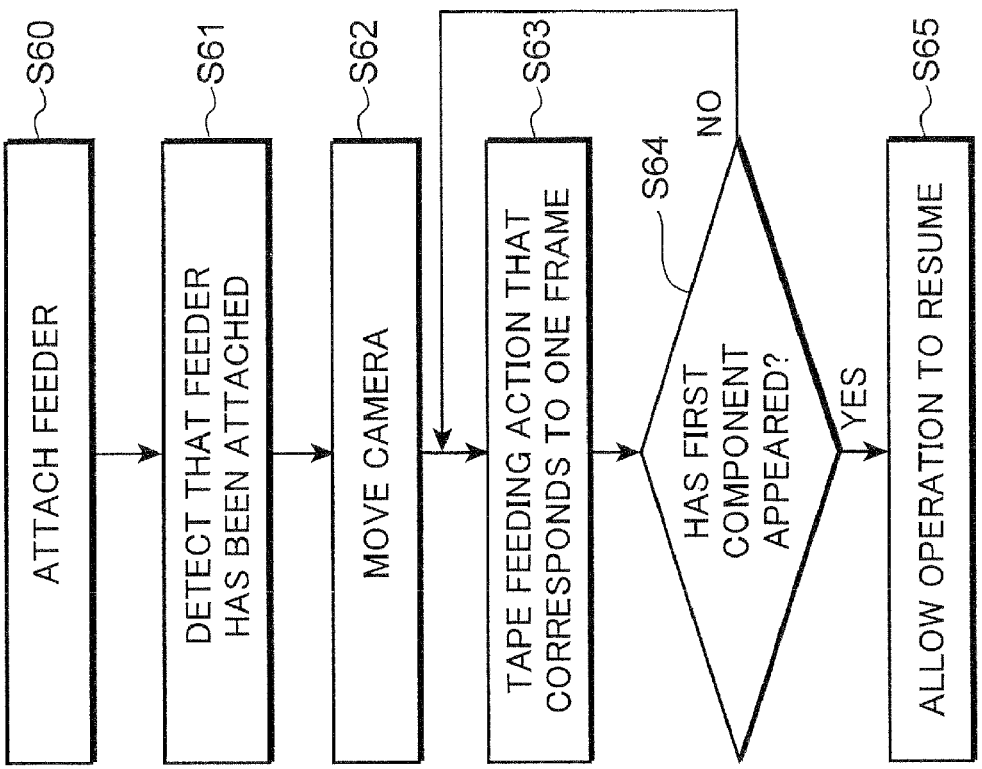
FIG. 11B is a flowchart showing another example of the procedure of actions of attaching the tape feeder to the mounting apparatus.
Figure 11A:
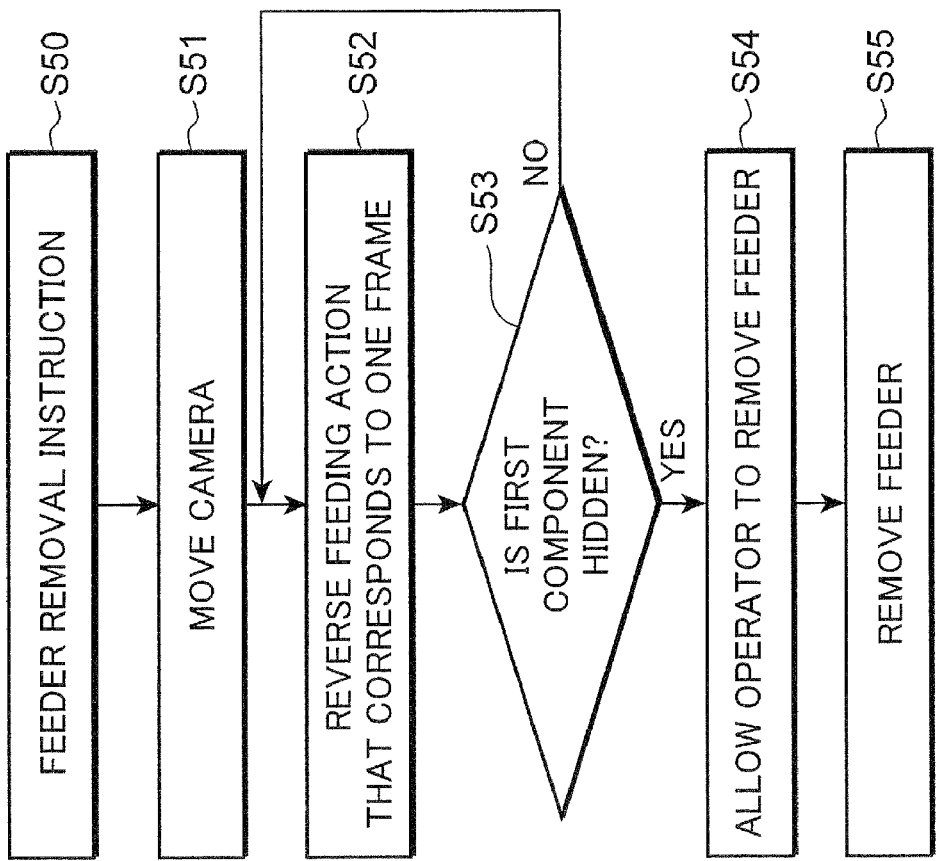
FIG. 11A is a flowchart showing another example of the procedure of actions of removing the tape feeder from the mounting apparatus.

FIG. 11A is a flowchart showing another example of the procedure of actions of removing any of the tape feeders from the mounting apparatus according to the present embodiment, and FIG. 11B is a flowchart showing another example of the procedure of actions of attaching the tape feeder to the mounting apparatus.

As shown in FIG. 11A, in this other example as well, the removal of any of the tape feeders 50 from the mounting apparatus 10 is initiated by a removal instruction issued from the controller 15 in the mounting apparatus 10 or the operator or any other person (step S50).

The feeder removal instruction is transferred to the controller 15 in the mounting apparatus 10, and the controller 15 in the mounting apparatus 10 moves the board photographing camera 48, which serves as photographing device attached to the head unit 40, to a position where the board photographing camera 48 photographs the vicinity of the pickup position 53 for the tape feeder 50 to be removed (step S51).

While the vicinity of the pickup position 53 for the tape feeder 50 is being photographed, the tape feeder 50 is instructed to carry out the reverse feeding action frame by frame (step S52) until in the captured image, the first component in the pickup position 53, in the position 53b immediately upstream thereof, or in any other position reaches any of the covered positions 57a (No in the step S53) where the tape cover 57 hides the first component.

When the first component is returned to any of the covered positions 57a and hidden (YES in the step S53), the controller 15 in the mounting apparatus 10 notifies the operator or any other person via a display section provided in the tape feeder 50, a monitor screen provided in the mounting apparatus 10, or any other display section that the tape feeder 50 is allowed to be removed (step S54). In response to the notification, the operator or any other person removes the tape feeder 50 from the mounting apparatus 10 (step S55).

The first component can thus be reliably returned to any of the covered positions when the tape feeder 50 is removed from the mounting apparatus 10, whereby it is possible to prevent in advance the component from dropping when the tape feeder 50 is removed.

As shown in FIG. 11B, in this other example as well, attaching the tape feeder 50 to the mounting apparatus 10 is initiated by the operator or the any other person's action of actually attaching the tape feeder 50 to the mounting apparatus 10 (step S60).

When the mounting apparatus 10 or the tape feeder 50 itself detects that the tape feeder 50 has been attached to the mounting apparatus 10 (step S61), the controller 15 in the mounting apparatus 10 moves the board photographing camera 48, which serves as photographing device attached to the head unit 40, to a position where the board photographing camera 48 photographs the vicinity of the pickup position 53 for the attached tape feeder 50 (step S62).

While the vicinity of the pickup position 53 for the tape feeder 50 is being photographed, the tape feeder 50 is instructed to carry out the tape feeding action frame by frame (step S63) until in the captured image, the first component appears and reaches the pickup position 53 or the position 53b immediately upstream thereof (No in the step S64).

When the first component appears and reaches the pickup position 53 or the position 53b immediately upstream thereof (YES in the step S64), the controller 15 in the mounting apparatus 10 allows the operation using the tape feeder 50 to resume (step S65).

In this way, when the tape feeder 50 is attached to the mounting apparatus 10, the tape feeding action is carried out in such a way that the first component reaches the pickup position 53 or the position 53b immediately upstream thereof. It is thus possible to quickly start manufacturing boards using the attached tape feeder 50.

Further, since it is judged in the image obtained by photographing the vicinity of the pickup position 53 whether the first component has reached the pickup position 53 or the position 53b immediately upstream thereof, the first component can be reliably fed to the pickup position 53 or the position 53b immediately upstream thereof.

A mounting apparatus according to a second embodiment of the present invention will be described below.

The configuration of the mounting apparatus according to the second embodiment is basically the same as that of the mounting apparatus according to the first embodiment (see FIGS. 1 to 4), but differs from the configuration of the mounting apparatus according to the first embodiment in that each of the tape feeders 50 is instructed to carry out only the tape feeding action in which components 64 held on the tape 60 are successively fed to the pickup position 53, but not to carry out the reverse feeding action in which components 64 are returned to an area upstream of the pickup position. Further, in this embodiment, the controller 15 in the mounting apparatus 10 and the controller 55 in each of the tape feeders 50 serve as a tape feeding action controller for instructing the tape feeder 50 to carry out the tape feeding action at each timing in the component mounting action.

The component mounting action in the second embodiment will be described below.

Figure 12:
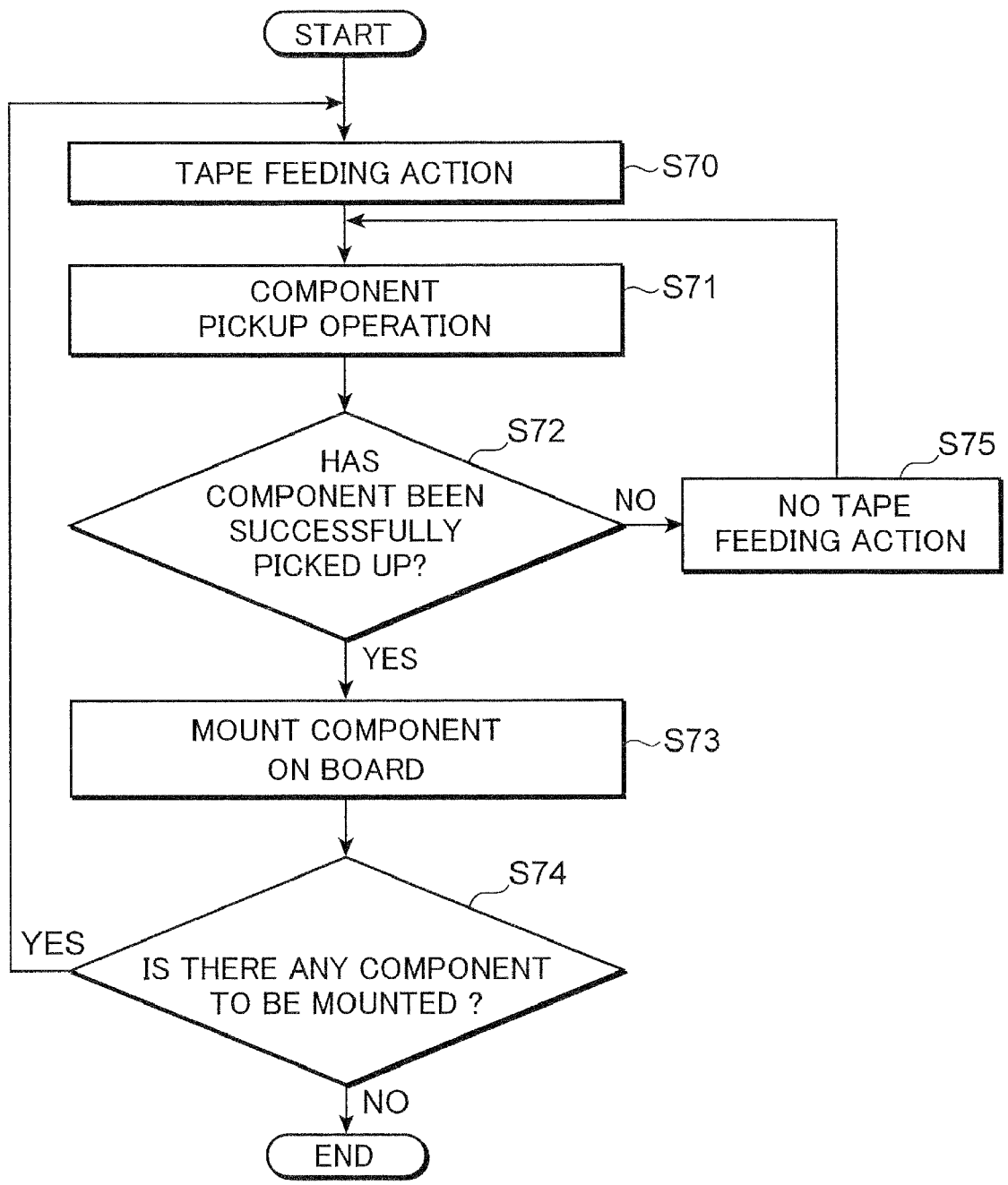
FIG. 12 is a flowchart showing the procedure of the component mounting action in a mounting apparatus according to a second embodiment of the present invention.

FIG. 12 is a flowchart showing the procedure of the component mounting action in the mounting apparatus according to the second embodiment. FIG. 13 explains a case where a component has been unsuccessfully picked up in the mounting action.

Figure 13A:
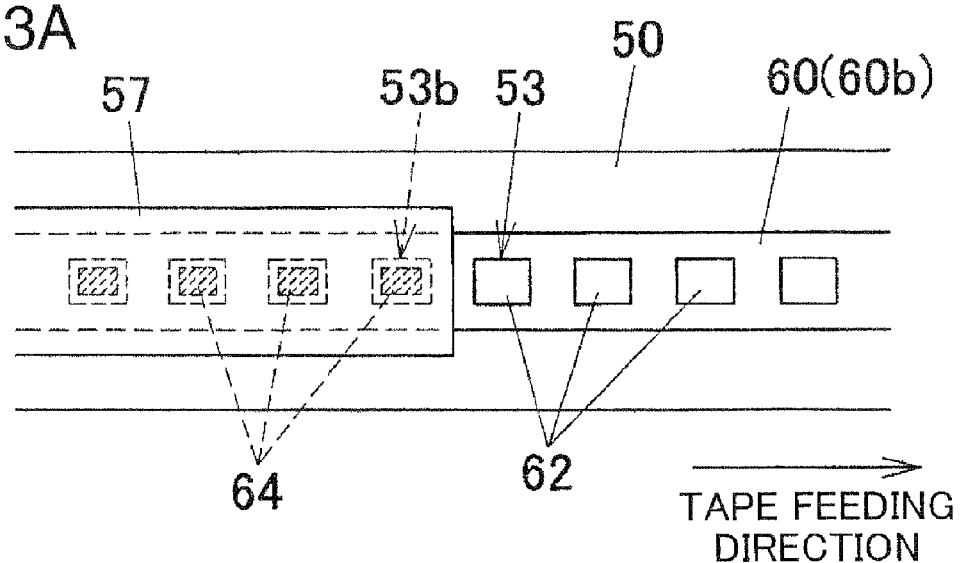
FIG. 13 explains a case where a component has been unsuccessfully picked up in the mounting action.

As shown in FIG. 13A, in any of the tape feeders 50 in the mounting apparatus 10 before the component mounting operation is carried out, the first component 64 is in the position 53b immediately upstream of the pickup position 53.

Figure 13B:
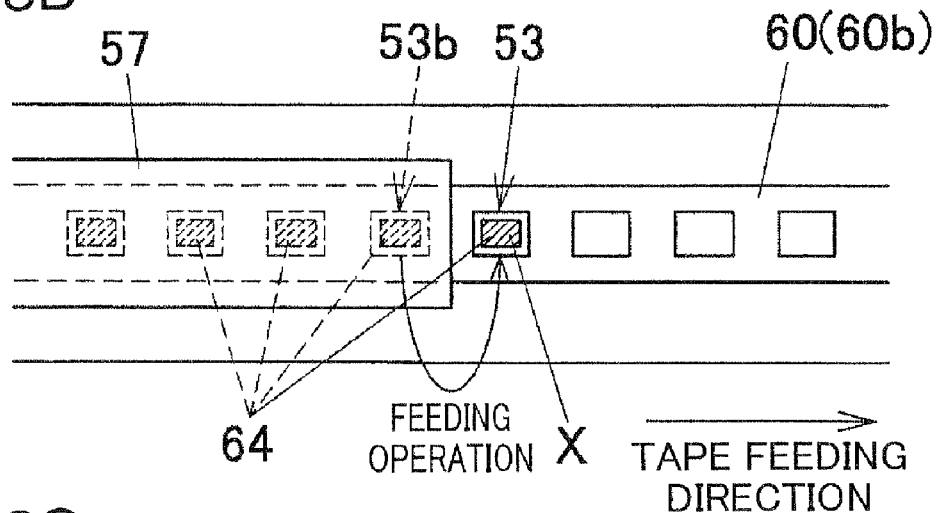

As shown in FIG. 12, in the component mounting action in the mounting apparatus 10, the tape feeding action is first carried out (step S70) to feed the first component 64 to the pickup position 53, as shown in FIG. 13B. The component pickup action in which any of the suction nozzles of the transfer head 41 sucks and picks up the component 64 fed to the pickup position 53 is then carried out (step S71).

It is then judged whether the component has been successfully picked up (step S72). When the component has been successfully picked up (YES in the step S72), the component picked up by the suction nozzle is mounted on a board (step S73). When there are still components to be mounted on the board, the above actions are repeated (YES in the step S74), whereas there is no component to be mounted, the procedure is terminated (NO in the step S74).

On the other hand, when the component has been unsuccessfully picked up (NO in the step S72), the component X that should have been picked up is left in the pickup position 53, as shown in FIG. 13B.

Figure 13C:
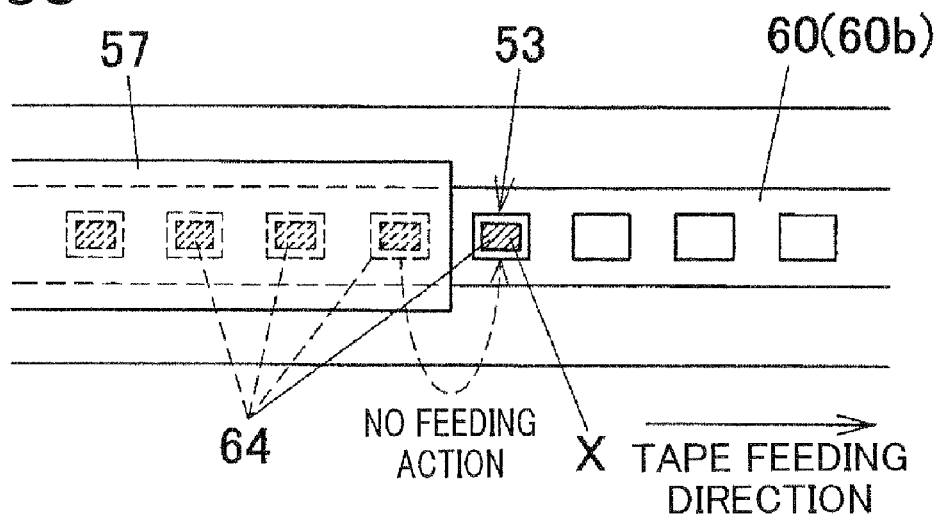

In this case, the mounting apparatus 10 does not carry out the tape feeding action (step S75), but the component pickup action is carried out again for the component X (step S71), as shown in FIG. 13C.

In this way, when the transfer head (suction nozzle) 41 has unsuccessfully picked up the component 64, no tape feeding action is carried out in the following pickup action. The component X that has been unsuccessfully picked up and hence left in the pickup position 53 can therefore be reused in the following pickup action. In this way, a component 64 that has been fed to the pickup position 53 but unsuccessfully sucked will not be discarded, whereby waste of components 64 can be reduced.

While the present invention has been described with reference to the above embodiments, the present invention is not limited to the above configurations, but appropriate changes may be made to the extent that such changes do not depart from the spirit of the present invention.

The present invention described above is summarized as follows:

Specifically, a tape feeder of the present invention includes a sprocket that engages a tape that holds components at predetermined intervals, a motor that rotates the sprocket to feed the tape to a predetermined pickup position, and a controller that drives and controls the motor. The controller is configured to carry out a tape feeding action in which the motor is driven in the forward direction to successively feed the components held on the tape to the pickup position, and a reverse feeding action in which the motor is driven in the reverse direction to return a component fed to the pickup position to a position upstream of the pickup position in the tape feeding direction.

Since the tape feeder can return a component that has been fed to the pickup position to a position upstream of the pickup position in the reverse feeding action, such a component can be reused, and hence the amount of waste of components can be reduced.

In the reverse feeding action, the tape can preferably be returned by a plurality of frames, where one frame corresponds to the interval between components held on the tape.

According to the above configuration, even when the tape is fed by a plurality of frames to check whether the tape feeding action is carried out, for example, in a stable manner, the plurality of components that have been fed to positions downstream of the pickup position can be returned to positions upstream of the pickup position. It is thus possible to prevent the components from being wasted.

In the tape feeder, when the controller receives a removal instruction to remove the tape feeder from a mounting apparatus, the controller preferably carries out the reverse feeding action to return the component that has been fed to the pickup position or the position immediately upstream thereof in the tape feeding direction to a covered position where the component is not exposed to the outside.

According to the above configuration, when the tape feeder is still attached to the mounting apparatus and a component has been fed to the pickup position or the position immediately upstream thereof, the component is returned in the reverse feeding action to a covered position where the component is not exposed to the outside when the tape feeder is removed from the mounting apparatus. It is thus possible to prevent in advance the component, for example, from dropping when the tape feeder is removed.

In this case, the controller may be configured to store the amount of return in the reverse feeding action carried out in response to the removal instruction and carry out the tape feeding action based on the stored amount of return when the tape feeder is attached to the mounting apparatus later.

According to the above configuration, when the tape feeder that has been removed from the mounting apparatus is reattached to the mounting apparatus, the tape feeding action is carried out based on the amount of return at the time of the removal. It is thus possible to quickly start manufacturing boards using the reattached tape feeder.

The tape feeder in which the controller carries out the reverse feeding action in response to the removal instruction issued from the mounting apparatus may further include photographing device for photographing the vicinity of the pickup position. When a removal instruction to remove the tape feeder from the mounting apparatus is received, the controller carries out the reverse feeding action based on the image captured by the photographing device in such a way that the first component reaches the covered position.

According to the above configuration, when the tape feeder is removed from the mounting apparatus, the first component can be reliably returned to the covered position. It is thus possible to prevent in advance the component from dropping when the tape feeder is removed.

On the other hand, a mounting apparatus according to the present invention is a mounting apparatus to which, among the tape feeders described above, the tape feeder configured to carry out the reverse feeding action when the tape feeder receives a removal instruction from the mounting apparatus can be attached. When the tape feeder is removed from the mounting apparatus, the amount of return in the reverse feeding action is related to identification information and stored, the identification information allowing the tape feeder to be identified, whereas when the tape feeder is attached to the mounting apparatus, the tape feeder is instructed to carry out the tape feeding action based on the amount of return that has been related to the identification information on the tape feeder and stored.

According to the mounting apparatus, when the tape feeder that has been removed from the mounting apparatus is reattached to the mounting apparatus, the tape feeding action is carried out based on the amount of return at the time of the removal. It is thus possible to quickly start manufacturing boards using the reattached tape feeder.

A mounting apparatus according to the present invention is a mounting apparatus to which, among the tape feeders described above, the tape feeder configured to carry out the reverse feeding action when the tape feeder receives a removal instruction from the mounting apparatus can be attached. The mounting apparatus includes photographing device for photographing the vicinity of the pickup position for the tape feeder. The mounting apparatus is configured, when the tape feeder is attached to the mounting apparatus, to instruct the photographing device to photograph the vicinity of the pickup position for the tape feeder and the tape feeder to carry out the tape feeding action in such a way that in the captured image, the first component reaches the pickup position or the position immediately upstream thereof in the tape feeding direction.

According to the mounting apparatus, when the tape feeder is attached to the mounting apparatus, the tape feeding action is carried out in such a way that in the captured image showing the vicinity of the pickup position, the first component reaches the pickup position or the position immediately upstream thereof. It is thus possible to quickly start manufacturing boards using the attached tape feeder.

Another mounting apparatus according to the present invention is a mounting apparatus to which a plurality of tape feeders can be attached, each of the tape feeders successively feeding components held on a component supplying tape at predetermined intervals to a predetermined pickup position. The mounting apparatus includes a transfer head that picks up and transfers a component fed to the pickup position for each of the tape feeders to a predetermined mounting position on a board, and a tape feeding action controller for controlling each of the tape feeders so as to feed components held on the tape to the pickup position and carry out a tape feeding action to place the component that has not been picked up in the pickup position again, when the transfer head has not picked up a component.

According to the mounting apparatus, for example, when the transfer head fails to pick up a component, the component is placed in the pickup position again.

Therefore, the component that has been fed to the pickup position but, for example, has been unsuccessfully sucked is not discarded but can be reused to reduce waste of components.

The tape feeding action controller is specifically configured to carry out the tape feeding action in which the components held on the tape are fed to the pickup position before the transfer head picks up a component, and carry out a reverse feeding action in which when the transfer head has not picked up a component, the component left in the pickup position is returned to a position upstream of the pickup position in the tape feeding direction.

According to the above configuration, for example, when the transfer head fails to pick up a component, the component left in the pickup position is returned to a position upstream of the pickup position in the tape feeding direction, and the returned component is fed to the pickup position again in the following pickup action. Therefore, the component that has been unsuccessfully sucked is not discarded but can be reused to reduce waste of components.

In this case, in the reverse feeding action, the tape feeding action controller can preferably return the tape can by a plurality of frames, where one frame corresponds to the interval between components held on the tape.

According to the above configuration, when the tape is fed by a plurality of frames due to reasons other than unsuccessful component pickup, for example, in order to check whether the tape feeding action is carried out, for example, in a stable manner, the plurality of components that have been fed to positions downstream of the pickup position can be returned to positions upstream of the pickup position. It is thus possible to prevent the components from being wasted.

In the mounting apparatus described above, the tape feeding action controller may instruct the tape feeder to carry out the tape feeding action in which the components held on the tape are fed to the pickup position before the transfer head picks up a component, but not to carry out the tape feeding action in the following component pickup action when the transfer head has not picked up a component.

According to the mounting apparatus, for example, when the transfer head fails to pick up a component, no tape feeding action is carried out in the following pickup action. Therefore, the component that has been unsuccessfully picked up and left in the pickup position can be reused in the following pickup action to reduce waste of components.

INDUSTRIAL APPLICABILITY

As described above, the tape feeder and the mounting apparatus according to the present invention use all components without waste and mount them on a printed board or other boards, and are hence useful particularly in a field of manufacturing electronic component mounted boards.

The invention claimed is:

1. A mounting apparatus to which a plurality of tape feeders are attachable, each of the tape feeders successively feeding components held on a component supplying tape at predetermined intervals to a predetermined pickup position, the mounting apparatus comprising:
 a transfer head to pick up and transfer a component fed to the pickup position for each of the tape feeders to a predetermined mounting position on a board; and
 a tape feeding action controller, said tape feeding action controller is adapted to control each of the tape feeders so as to feed components held on the tape to the pickup position before the transfer head picks up a component, and carry out a tape feeding action to place the component that has not been picked up in the pickup position again, by allowing a reverse feeding action in which the component left in the pickup position is returned to a position upstream of the pickup position in the tape feeding direction by at least one frame which corresponds to an interval between the components, when the transfer head has not picked up a component.

2. The mounting apparatus according to claim 1, wherein in the reverse feeding action, the tape feeding action controller is adapted to return the tape by a plurality of the frames.

3. The mounting apparatus according to claim 1, wherein the tape feeding action controller instructs the tape feeder to carry out the tape feeding action in which the components held on the tape are fed to the pickup position before the transfer head picks up a component, but not to carry out the tape feeding action in the following component pickup action when the transfer head has not picked up a component.

* * * * *